(12) United States Patent
Herdt

(10) Patent No.: US 6,414,873 B1
(45) Date of Patent: Jul. 2, 2002

(54) NVSRAM WITH MULTIPLE NON-VOLATILE MEMORY CELLS FOR EACH SRAM MEMORY CELL

(75) Inventor: Christian E. Herdt, Westborough, MA (US)

(73) Assignee: Simtek Corporation, Colorado Springs, CO (US)

( * ) Notice: Subject to any disclaimer, the term of this patent is extended or adjusted under 35 U.S.C. 154(b) by 0 days.

(21) Appl. No.: 09/681,317

(22) Filed: Mar. 16, 2001

(51) Int. Cl.[7] .............................................. G11C 14/00
(52) U.S. Cl. ............................ 365/185.08; 365/185.03; 365/185.05; 365/185.28; 365/154
(58) Field of Search ...................... 365/185.08, 185.03, 365/185.05, 185.28, 185.01, 154, 129

(56) References Cited

U.S. PATENT DOCUMENTS

| | | | |
|---|---|---|---|
| 4,142,176 A | 2/1979 | Dozier ........................ 340/166 |
| 4,271,487 A | 6/1981 | Craycraft et al. ........... 365/189 |
| 4,541,073 A | 9/1985 | Brice et al. .................. 365/156 |
| 4,959,812 A | 9/1990 | Momodomi et al. ........ 365/185 |
| 4,980,859 A | 12/1990 | Guterman et al. .......... 365/154 |
| 5,008,856 A | 4/1991 | Iwahashi ..................... 365/185 |
| 5,065,362 A | 11/1991 | Herdt et al. ................. 365/154 |
| 5,546,341 A | 8/1996 | Suh et al. .............. 365/185.53 |
| 5,602,776 A | * | 2/1997 | Herdt et al. ........... 365/185.08 |
| 5,723,888 A | | 3/1998 | Yu .............................. 257/319 |
| 5,798,547 A | | 8/1998 | Urai ........................... 257/316 |
| 5,828,599 A | * | 10/1998 | Herdt et al. ........... 365/185.08 |
| 5,892,712 A | | 4/1999 | Hirose et al. .......... 365/185.07 |
| 5,914,895 A | * | 6/1999 | Jenne ..................... 365/185.08 |
| 6,026,018 A | * | 2/2000 | Herdt et al. ........... 365/185.07 |
| 6,097,629 A | * | 8/2000 | Dietrich et al. ........ 365/185.07 |
| 6,163,048 A | | 12/2000 | Hirose et al. ................ 257/315 |
| 6,249,479 B1 | * | 6/2001 | Tanzawa et al. ....... 365/230.06 |

OTHER PUBLICATIONS

Herdt, Christian E. and Paz de Araujo, Carlos A., "Analysis, Measurement, and Simulation of Dynamic Write Inhibit in an nvSRAM Cell", 1992, IEEE.

* cited by examiner

*Primary Examiner*—Hoai V. Ho
(74) *Attorney, Agent, or Firm*—Holme Roberts & Owen LLP; Christopher J. Kulish, Esq.

(57) ABSTRACT

The invention relates to a non-volatile, static random access memory (nvSRAM) in which there are at least two, non-volatile memory cells associated with each SRAM memory cell. The non-volatile memory cells are capable of being programmed with whatever bit of information is present in the SRAM at two different times. In one embodiment, the non-volatile memory cells are capable of being randomly programmed, i.e., programmed in any order. Further, the bits of data programmed into the non-volatile memory cells can be recalled in any order, i.e., randomly recalled.

19 Claims, 5 Drawing Sheets

NVSRAM WITH MULTIPLE NON-VOLATILE MEMORY CELLS FOR EACH SRAM MEMORY CELL

FIELD OF THE INVENTION

The present invention relates to a non-volatile, static random access memory (nvSRAM).

BACKGROUND OF THE INVENTION

In general, a computer system is comprised of a memory for holding data and programs, a processor for executing the programs or operating on the data held in memory, and an input/output device for facilitating communications between the computer system and a user. There are several different types of digital memories available for use in the memory portion of a computer system. In many instances, the particular application in which the computer system is intended to be used dictates the type of memory that is appropriate for all or a portion of the memory of the computer system. For instance, one application for a computer system in which an nvSRAM may be appropriate is in a portable. computer system. Portable computer systems are generally designed to operate, if needed, with power supplied by a battery housed within the system. If the battery becomes incapable of providing power to the system and an alternative source of power is not available, the data held in memory could become irretrievably lost. In such applications, it is desirable to use an nvSRAM because the static random, access memory (SRAM) portion is capable of retaining the data while power is present and providing the performance needed during normal operations, and the non-volatile memory (nv) portion is capable of retaining data for an extended period of time after power has been removed and once power is restored, re-establishing the data in the SRAM portion.

A basic nvSRAM memory device is comprised of: (1) a plurality of nvSRAM memory cells; and (2) a controller for managing the operations of the nvSRAM memory cells. A typical nvSRAM cell is comprised of a static random access memory cell and a non-volatile memory cell. Briefly, the terms "random access memory" and "RAM" refer to the ability to access any one of a plurality of cells in the memory at any time to write/read data to/from the accessed cell. In contrast, other types of memory require that other memory locations be traversed before the desired memory location can be accessed. These types of memories (magnetic tape, for example) are typically much slower than a random access memories. The term "static" refers to the ability of the memory to retain data as long as power is being supplied. In contrast, the term "dynamic" refers to memories that retain data as long as power is being supplied and the memory is being periodically refreshed. The term non-volatile refers to the ability of a memory cell to retain data in the absence of power.

The SRAM memory cell in an nvSRAM cell is capable of communicating a bit of data to and from an exterior environment. Additionally, the SRAM memory cell can provide the nv memory cell with a copy of the bit of data, thereby providing backup storage to the SRAM cell in the event power is removed from the nvSRAM cell. The SRAM cell, as long as power is being provided, is capable of: (1) receiving a bit of data from an exterior environment; (2) retaining the bit of data; and (3) transmitting the bit of data back to the exterior environment. If, however, power is removed from the SRAM memory cell, the SRAM memory cell will lose the bit of data. The nv cell prevents such a loss by providing a backup to the SRAM memory cell. In backing up the SRAM memory cell, the nv memory cell provides the ability to: (1) receive a copy of the bit of data stored in the SRAM memory cell; (2) retain the bit of data in the absence of power being provided to the nvSRAM memory cell; and (3) return the bit of data to the SRAM cell when power is present. The copying of a bit of data from the SRAM memory cell into the nv memory cell is referred to as a store operation. The store operation has two phases, an erase phase and a program phase. In the erase phase, the nv memory cell is conditioned so that it can accept a copy of the bit of data presently retained in the SRAM memory cell. The program phase involves copying the bit of data in the SRAM memory cell to the nv memory cell. Returning a previously copied bit of data from the nv memory cell to the SRAM memory cell is referred to as a recall operation.

SUMMARY OF THE INVENTION

The present invention provides an nvSRAM that, for every SRAM memory cell, has an nv portion that is comprised of a plurality of nv memory cells. By providing a plurality of nv memory cells, a plurality of data bits existing in the SRAM memory cell at different times can be stored in the nv portion and then later recalled to the SRAM portion. For example, in an array of nvSRAMs in which two nv memory cells are associated with each SRAM memory cell, the first nv memory cell associated with each SRAM memory cell could store information relating to a first picture that is to be displayed on the monitor of a computer system and the second nv memory cell associated with each SRAM memory cell could store information relating to a second picture that is also to be displayed on the monitor. An nvSRAM with more. than two nv memory cells for each SRAM is also possible.

In one embodiment, the nvSRAM provides the flexibility of allowing the nv memory cells to be randomly programmed, i.e., programmed in any order. For example, in an nvSRAM in which two, series-connected, nv memory cells are associated with each SRAM memory cell and the first nv memory cell is located closer to the SRAM memory cell than the second nv memory cell, the controller is capable of causing the first nv memory cell to be programmed before the second memory cell and visa versa. In one embodiment, this flexibility is achieved by implementing an nvSRAM structure that, with respect to each of the nv memory cells associated with a specific SRAM, causes one of two transistors that form an nv memory cell to be programmed and the other transistor to be dynamically program inhibited during a store operation. The ability to perform a dynamic program inhibit has the advantages of: (1) allowing random programming of the series-connected nv memory cells; (2) reducing the number of nodes within the nvSRAM to which high voltage must be applied; and (3) allowing the spacing between circuit elements to be reduced, thereby permitting a greater density of nvSRAMS cells for a given area.

In a further embodiment, the nvSRAM includes a controller for issuing the signals that permit the bits of data stored in the nv memory cells to be randomly recalled into the SRAM memory cell. For example, in an nvSRAM in which two, series-connected nv memory cells are associated with each SRAM memory cell and the first nv memory cell is located closer to the SRAM memory cell than the second nv memory cell, the controller is capable of causing the bit of data stored in the second nv memory cell to be recalled before the bit of data in the first memory cell and visa versa.

As previously noted, one type of nvSRAM associates at least two, series-connect nv memory cells with an SRAM cell. Another embodiment, however, employs at least two, parallel-connected nv memory cells with an SRAM cell.

DETAILED DESCRIPTION

Figure 1:
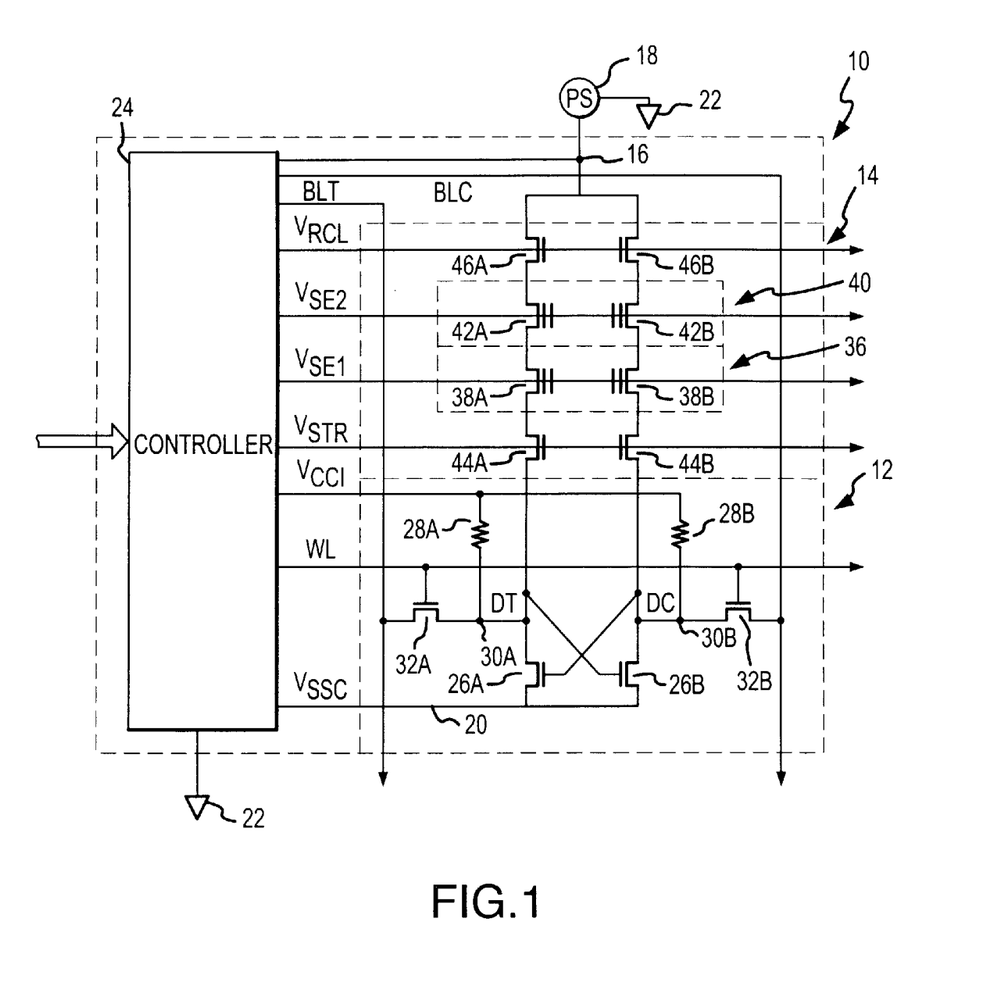
FIG. 1 illustrates an nvSRAM device that includes a memory cell comprised of a static random access memory (SRAM) memory cell and two, series-connected, non-volatile (nv) memory cells and a controller for managing: (a) the transfer of a bits of data between the SRAM memory cell and the nv memory cells and (b) the transfer of bits of data between the SRAM memory cell and the exterior environment.

FIG. 1 illustrates an nvSRAM device with a single SRAM and two, series-connected, nv memory cells 10, hereinafter referred to as nvSRAM device 10. While the nvSRAM device 10 is illustrated as having a single nvSRAM memory cell (in this case, the single SRAM and two nv memory cells), it should be appreciated that an nvSRAM device typically includes a plurality of nvSRAM cells that are integrated with a controller onto a single semiconductor chip.

The nvSRAM device 10 includes an SRAM 12 cell that is capable of receiving a bit of data from an exterior environment via bit lines, storing the bit of data, and transmitting the bit of data back to the exterior environment via the bit lines at a later time. In an array of nvSRAM cells, a group of eight bits, which is known as a byte of information, is transferred to and from the exterior environment by the bit lines and word lines that enable a particular group of eight nvSRAM cells to transfer a word of information to or from the exterior environment via the bit lines. It should be appreciated that the array can be configured to transfer larger or smaller groups of bits to and from the exterior environment. For example, four bits, which is known as a nibble, can be transferred to and from the exterior environment. As previously mentioned, the SRAM cell 12 requires power to retain a bit of data. If power is removed from the SRAM cell 12, the bit of data retained therein is lost.

The nvSRAM device 10 also includes an nv portion 14 that is capable of: (1) receiving two bits of data from the SRAM cell 12 as a result of two store operations that each provide one bit of data and occur when sufficient power is being provided to the device 10; (2) retaining the two bits of data even in the absence of power being provided to the nvSRAM device 10; and (3) then transmitting the bits of data back to the SRAM cell 12 in two separate recall operations that occur when sufficient: power is being provided to the device 10.

To provide power to the nvSRAM device 10, a power line 16 is provided for connecting the nvSRAM device 10 to a power supply 18 and a ground line 20 (Vssc) is provided for connecting the nvSRAM device to ground 22. The nvSRAM 10 is suited for use with a standard voltage power supply, such as a 5 volt power supply, or a lower voltage power supply, such as a 3 volt power supply. Typically, power supplies are specified as operating within a range of voltages. For example, a 5 volt power supply provides power at a voltage that varies±10%, i.e., between 4.5 volts and 5.5 volts. Consequently, the nvSRAM device 10 must be capable of operating within this voltage range. For convenience, the range is hereinafter omitted from the voltage specification of the power supply 18. For example, a 3 volt±10% power supply will be referred to as a 3 volt power supply. It should also be understood at this point that when the voltage being provided by the power supply 18 nears or goes below the lower end of the range, the nvSRAM device 10 must consider a complete power loss to be imminent and take the appropriate action to transfer data from the SRAM cell 12 into the nv portion 14.

A controller 24 is included in the nvSRAM device 10 for: (1) providing signals to SRAM cell 12 to transfer a bit of data between the SRAM cell 12 and the exterior environment; (2) providing signals to the SRAM cell 12 and the nv portion 14 to copy a bit of data from the SRAM cell 12 into the nv portion 14, i.e., cause a store operation to be performed; and (3) providing signals to the SRAM cell 12 and the nv portion 14 to copy a bit of data from the nv portion 14 to the SRAM cell 12, i.e., cause a recall operation to be performed. The controller 24 performs the noted operations based upon signals received from a device, typically a microprocessor, that is located exterior to the nvSRAM device 10. For example, if a microprocessor required the bit of data stored in the SRAM 12, it would issue a command to the controller 24. In response, the controller 24 would provide the signals to the SRAM cell 12 to cause the bit of data in the SRAM cell 12 to be transferred to the exterior environment. The microprocessor can also request a store or recall operation with respect to one or the other of the nv memory cells in the nv portion 14. The controller also performs certain operations without direction from a microprocessor. For instance, the controller 24 is capable of independently sensing when power is initially being applied to the device 10 and, in response, causing a recall operation (power-up recall operation) to be performed with respect to one of the nv memory cells in the nv portion 14. Conversely, the controller 24 is capable of sensing when power is being removed from the device 10 and, in response, causing a store operation (power-down store operation) to be performed with respect to one of the nv memory cells in the nv portion 14. The nv memory cell in the nv portion 14 to which the bit of data in the SRAM cell 12 is transferred in the case of a power-down and the nv memory cell in the nv portion 14 from which a bit of data is recalled in the event of a power-up is established in the nvSRAM 10 during manufacture. Alternatively, the nvSRAM 10 is designed to permit the user to configure or define which nv memory cell is to be used in power-down store operations and which nv memory cell is to be used in power-up recall operations. This configurability can be achieved via a command that is issued to the nvSRAM 10 or any of the other ways known in the art.

With the foregoing general description of the nvSRAM device 10 in mind, the nvSRAM device 10 is now described in greater detail. Generally the nvSRAM device 10 is comprised of a number of n-channel, Field-Effect Transistors (FETs) and resistors. It should, however, be appreciated that other types of transistors, such as p-channel FETs, bipolar transistors, and combinations of different types of transistors can be utilized.

The SRAM cell 12 includes a first SRAM FET 26A and a second SRAM FET 26B that are in a 1-bit latch configuration in which the drain of each FET is coupled to the gate of the other FET and the source of one FET is coupled to the source of the other FET In the latch configuration, the first and second SRAM FETs 26A, 26B operate as switches that are either in an ON state an OFF state. More specifically, the latch operates so that when one of the first and second SRAM FETs 26A, 26B is in an ON state the other is necessarily in an OFF state. This manner of operation permits the latch to differentially store a bit of data, which can have either a 0 state or 1 state. For example, if a bit of data is in a 0 state, the latch can represent the 0 state of the bit by placing the first SRAM FET 26A in an ON state and the second SRAM FET 26B in an OFF state. Conversely, if the bit of data is in a 1 state, the latch can represent the 1 state of the bit by placing the first SRAM FET 26A in an OFF state and a second SRAM FET 26B in an ON state.

The SRAM cell 12 further includes first and second pull-up resistors 28A, 28B to aid the first and second SRAM FETs 26A, 26B in latching a bit of data from the nv portion 14 or from the exterior environment. The first pull-up resistor 28A is located between the drain of the first SRAM FET 26A, which is identified as node 30A, and,a line that carries a $V_{CCI}$ voltage signal, a voltage signal internal to the chip that is substantially equal to the voltage provided by the external power supply 18. Similarly, the second pull-up resistor 28B is located between node 30B and the line that carries the $V_{CCI}$ voltage signal. There are a number of alternatives to the use of pull-up resistors. For example, depletion n-channel FETs or cross-coupled p-channel FETs can be utilized.

Also included in the SRAM cell 12 are first and second transfer FETs 32A, 32B for transferring a bit of data between the latch formed by the first and second SRAM FETs 26A, 26B and the exterior environment. The gate of each of the first and second transfer FETs 32A, 32B is connected to a word line WL; the drains of the first and second transfer FETs 32A, 32B are respectively connected to nodes 30A, 30B; and the sources of the first and second transfer FETs 32A, 32B are respectively connected to bit lines BLT and BLC. The first and second transfer FETs 32A, 32B function as switches that are placed in an ON state to transfer a bit of data between the latch and the exterior environment and otherwise placed in an OFF state. The state of the first and second transfer FETs 32A, 32B, either ON or OFF, is controlled by a signal applied to the word line WL. If the first and second transfer FETs 32A, 32B are in an ON state, a bit of data can be transferred between the latch and the exterior environment via the bit lines BLT and BLC.

The nv portion 14 includes a first nv memory cell 36 for storing the state of the SRAM 12 at a first time. The first nv memory cell 36 includes a first silicon nitride oxide semiconductor (SNOS) FET 38A and a second SNOS FET 38B for respectively storing the state of the first SRAM FET 26A and the second SRAM FET 26B. The state of the first and second SRAM FETs 26A, 26B is stored in the first and second SNOS FETs 38A, 38B by forcing, in a store operation, the threshold voltages for turning ON the first and second SNOS FETs 38A, 38B to reflect the states of the first and second SRAM FETs 26A, 26B. For example, if the first SRAM FET 26A is in an OFF state and the second SRAM FET 26B is in an ON state, the store operation would reflect this state of the first and second SRAM FETs 26A, 26B by forcing the threshold voltage for turning ON the first SNOS FET 38A to be more negative than the threshold voltage for turning on the second SNOS FET 38B. It should be appreciated that the SNOS FETs can be replaced with other types of transistors that also have adjustable threshold voltages, such as silicon oxide nitride oxide semiconductor transistors (SONOS), floating gate transistors and ferroelectric transistors appropriately connected for a shadow RAM.

The nv portion 14 further includes a second nv memory cell 40 for storing the state of the SRAM 12 at a second time. The second nv memory cell 40 includes a third SNOS FET 42A and a fourth SNOS FET 42B for respectively storing the state of the first SRAM FET 26A and the second SRAM FET 26B.

It should be appreciated that the nv portion 14 can include additional nv memory cells. As the number of nv memory cells increases, the available current for a recall operation decreases. However, the capacitance associated with each of the SRAM nodes 30A, 30B is so low that a relatively small amount of current is needed for a recall operation. Consequently, a large number of nv memory cells, at least eight, can be incorporated into the nv portion 14.

The nv cell 14 further includes a first store FET 44A and a second store FET 44B that operate as switches during store and recall operations to appropriately configure the nv portion 14 for the transfer of a bit of data between the SRAM cell 12 and the nv portion 14. More specifically, the first and second store FETs 44A, 44B function to connect the nv portion 14 to the SRAM cell 12 during store and recall operations and to otherwise disconnect the nv portion 14 from the SRAM cell 12. The state of the first and second store FETs 44A, 44B is controlled by a $V_{STR}$ signal that is applied to the gates of the FETs. More specifically, if the $V_{STR}$ signal is LOW, the first and second store FETs 44A, 44B are turned OFF to disconnect the nv portion 14 from the SRAM cell 12. Conversely, if the $V_{STR}$ signal is HIGH, the first and second store FETs 44A, 44B are turned ON to connect the nv portion 14 to the SRAM, cell 12.

The nv portion 14 further includes a first recall FET 46A and a second recall FET 46B that also function as switches that are used to place the nv portion 14 in the appropriate configuration for transferring a bit of data between the SRAM cell 12 and the nv portion 14 during store and recall operations. More specifically, the first and second recall FETs 46A, 46B function to connect the nv portion 14 to the power supply 18 during a recall operation and to disconnect the nv portion 14 from the power supply 18 during a store operation and otherwise. The state of the first and second recall FETs 46A, 46B is controlled by a $V_{RCL}$ signal that is applied to the gates of the FETs. More specifically, if the $V_{RCL}$ signal is LOW, the first and second recall FETs 46A, 46B are turned OFF to disconnect the nv portion 14 from the power supply 18. Conversely, if the $V_{RCL}$ signal is HIGH, the first and second recall FETs 46A, 46B are turned ON to connect the nv portion 14 to the power supply 18.

Figure 2:
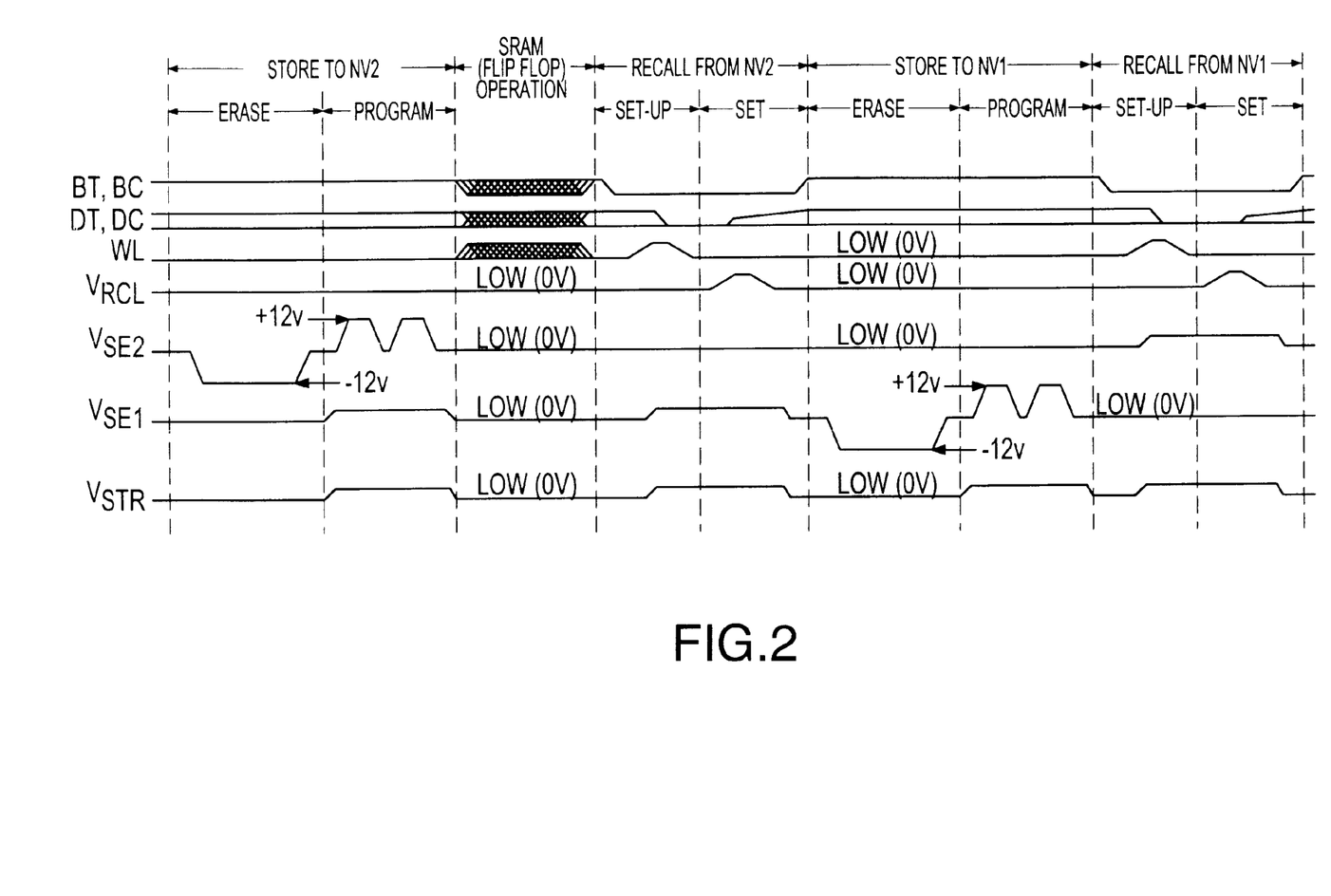
FIG. 2 is a timing diagram for the nvSRAM shown in FIG. 1 of: (a) the store and recall operations that occur between the two, series-connected, non-volatile memory cells and the SRAM memory cell and (b) the operations associated with transferring a bit of data between the SRAM and the exterior environment.

FIG. 2 illustrates each of the following operations associated with the nvSRAM 10: (1) a store operation to the first nv memory cell 36 (NV1); (2) a store operation to the second nv memory cell 40 (NV2); (3) a recall operation from the first nv memory cell 36; (4) a recall operation from the second nv memory cell 40; and (5) the transfer of a bit of data between the SRAM and the exterior environment. While the operations are shown as in FIG. 2 as occurring in a particular sequence, the operations and, in particular, the store and recall operations can occur in any sequence, i.e., can occur in a random sequence.

Initially, the store operation with respect to the second nv memory cell 40 is described. The store operation can occur in response to the detection by the controller 24 of a possible loss of power or in response to a command received by the controller 24. The store operation with respect to the second nv memory cell 40 includes an erase phase and a program phase. During the erase phase, the controller 24 places the third and fourth SNOS FETs 42A, 42B in a known state so that they can be subsequently programmed to reflect the state of the first and second SRAM FETs 26A, 26B. At the start of the erase phase, the controller 24 places: (1) $V_{RCL}$ in a LOW condition to turn OFF the first and second recall FETs 46A, 46B and thereby disconnect the nv portion 14 from the power supply 18; (2) $V_{STR}$ in a LOW condition to turn OFF the first and second store FETs 44A, 44B and thereby disconnect the nv portion 14 from the SRAM cell 12; (3) $V_{SE1}$ in a LOW condition to put the gates of the first and second SNOS FETs 38A, 38B in neutral positions; (4) $V_{SE2}$ at the ground voltage, i.e., 0 volts; (5) $V_{CCP}$, BLT and BLC in a HIGH condition; and (6) WL and Vssc in a LOW condition. Next, the controller transitions the $V_{SE2}$ from ground to a large negative voltage (referred to as an erase voltage) to place the third and fourth SNOS FETs 42A, 42B in a known condition. Specifically, after application of the erase voltage, the third and fourth SNOS FETs 42A, 42B each have a substantially identical depletion threshold voltage, e.g., −3 V. Towards the end of the erase phase or at the beginning of the program phase, the controller 24 raises the $V_{STR}$ signal from the LOW condition to a HIGH condition to connect the SRAM cell 12 to the nv cell 14. At the end of the erase phase, the controller 24 causes the $V_{SE2}$ signal to transition from the large negative voltage to ground. The erase phase takes approximately 6–8 ms to complete.

With continued reference to FIG. 2, the program phase of the store operation causes the thresholds of the third and fourth SNOS FETs to be set in a manner that reflects the value of the bit of data stored in the SRAM 12. The program operation commences with the controller establishing or having previously established: (1) $V_{STR}$ in a HIGH condition to connect the nv portion 14 to the SRAM 12; (2) $V_{SE1}$ in a HIGH condition to insure that the first and second SNOS FETs 38A, 38B are turned ON; (3) $V_{RCL}$ in a LOW condition to disconnect the power supply 18 from the nv portion 14; and (4) $V_{SE2}$ at ground. The controller 24 does not change the state of the $V_{CCP}$, BLT, BLC or WL relative to the erase portion. However, Vssc is or may be increased to approximately 1.2 volts to increase the field isolation when there is a high voltage running between the transistors associated with the nv portion 14. Subsequently, the controller 24 cycles the $V_{SE2}$ between ground and a large positive voltage (referred to as a program voltage) to establish different threshold levels in the third and fourth SNOS FETs 42A, 42B that reflect the state of the first and second SRAM FETs 26A, 26B of the SRAM cell 12. More specifically, the threshold of one of the third and fourth SNOS FETs 42A, 42B is changed or "programmed" and the threshold of the other of the third and fourth SNOS FETs 42A, 42B is left unchanged or "program inhibited" relative to the erase phase. For example, if the erase phase established a depletion threshold voltage of −3V on the third and fourth SNOS FETs 42A, 42B, the program phase would cause the threshold of one of the third and fourth SNOS FETs 42A, 42B to be programmed to +3V and the threshold of the other of the third and fourth SNOS FETS 42A, 42B to remain at −3V. At the end of the program phase, the controller 24 causes: (1) $V_{SE2}$ to transition from 12 volts, the program voltage, to ground; and (2) $V_{STR}$ and $V_{SE1}$ to transition from the HIGH state to the LOW state to disconnect the second nv memory cell 40 from the SRAM cell 12. The program phase takes approximately 1.5–2 ms to complete.

The programming phase implements a "dynamic" program inhibit with respect to the one of the third and fourth SNOS FETs 42A, 42B whose threshold remains unchanged after the program operation. To elaborate, the one of the third and fourth SNOS FETs 42A, 42B whose threshold remains unchanged is associated with whichever of the nodes 30A, 30B in the SRAM 12 is in a HIGH state. In this case, the gate and source of the one of the first and second store FETs 44A, 44B that is associated with the one of the third and fourth SNOS FETs 42A, 42B whose threshold remains unchanged is cut-off. As a consequence, the relevant store FET cannot supply any charge as $V_{SE2}$ is cycled between ground and the large positive voltage. As such, the surface potential directly beneath the gate of one of the third and fourth SNOS FETs 42A, 42B whose threshold remains unchanged from the erase phase couples up to the $V_{SE2}$ so that there is no voltage drop across the gate dielectric and, as a consequence, no tunneling of charge which changes the threshold voltage. In contrast, in the case of the one of the third and fourth SNOS FETs 42A, 42B whose threshold is programmed, the relevant one of the first and second store FETs 42A, 42B is ON. As a consequence, the surface potential of the relevant one of the third and fourth SNOS FETs 42A, 42B is at ground, the $V_{SE2}$ drops across the gate of the SNOS FET, and tunneling occurs across the ultra-thin oxide of the SNOS FET which leave the nitride with a negative charge and the SNOS with a new threshold, e.g., +3V.

With continuing reference to FIG. 2, the store operation with respect to the first nv memory cell 36 has both an erase phase and program phase, just as with the store operation for the second nv memory cell 40. Further, the controller 24 manages the state of the BLT, BLC, WL, $V_{RCL}$ and $V_{STR}$ during the erase and program phases in the same manner as noted with respect to store operation for the second nv memory cell 40. However, for the store operation with respect to the first nv memory cell 36, the controller 24 manages the $V_{SE1}$ and the $V_{SE2}$ signals differently. More specifically, during the erase phase, the controller 24 places $V_{SE2}$ in a LOW condition to place the gates of the third and fourth SNOS FETs 42A, 42B in neutral positions. The controller 24 establishes $V_{SE1}$ at ground at the beginning of the erase phase. The controller 24 then causes $V_{SE1}$ to transition from ground to a large negative voltage to establish the depletion thresholds for the first and second SNOS FETs 38A, 38B. Finally, at the end of the erase phase, the controller causes $V_{SE1}$ to return to ground. In the program phase, the controller 24 maintains $V_{SE2}$ in a LOW condition to isolate the first nv memory cell 36 from the second nv memory cell 40 and the power supply 18. The controller 24 cycles $V_{SE1}$ to program the thresholds of the first nv memory cell 36 to reflect the state of the SRAM 12. Just as with the program operation of the second nv memory cell 40, the program operation of the first nv memory cell 36 utilizes dynamic program inhibit.

The use of dynamic program inhibit during the store operations associated with the first nv memory cell 36 and the second nv memory cell 40 has a number of advantages. Specifically, dynamic program inhibit reduces the number of nodes within an nvSRAM to which a high voltage must be applied during store operation relative to, for example, a static program inhibit. This, in turn, allows the elements of an nvSRAM to be positioned closer to one another, thereby increasing the number of nvSRAM memory cells that can be established in a given area of an integrated circuit. Further, the use of dynamic program inhibit in the store operations associated with both the first nv memory cell 36 and the second nv memory cell 40 permits the nv memory cells to be randomly programmed, i.e., programmed in any order, because the high voltages are confined to the gates of the SNOS FETs and the underlying surfaces.

With continuing reference to FIG. 2, the recall operation with respect to the second nv memory cell 40 is described. The recall operation can occur in response to the controller 24 detecting that the power being provided to the nvSRAM 10 has exceeded a predetermined threshold or in response to a command received by the controller 24. The recall operation involves a set-up phase in which the SRAM cell 12 is placed in a condition that assures that a bit of data can be transferred from the nv portion 14 to the SRAM cell 12 and a set phase in which a bit of data resident in the second nv memory cell 40 is copied into the SRAM cell 12. At the beginning of the set-up phase, the controller 24 establishes: (1) $V_{RCL}$ in a LOW condition to disconnect the nv portion 14 from the power supply 18; (2) $V_{STR}$ in a LOW condition to disconnect the nv portion 14 from the SRAM cell 12; (3) $V_{SE1}$ is placed in a LOW condition to place the gates of the first and second SNOS FETs 38A, 38B in neutral positions; (4) $V_{SE2}$ is grounded; (5) WL is in a LOW condition; (6) Vssc in a LOW condition; (7) $V_{CCI}$ in a HIGH condition; and (8) BLT and BLC in a HIGH condition. Subsequently, the controller 24 places both $V_{STR}$ and $V_{SE1}$ in a HIGH condition to connect the second nv memory cell 40 to the SRAM cell 12. Further, the controller 24 places $V_{CCI}$, BLT and BLC in a LOW condition to remove power from the SRAM cell 12 and to isolate the voltages at nodes 30A, 30B. At this point, the controller 24 cycles WL to discharge nodes 30A, 30B and thereby place both of the nodes 30A, 30B in a LOW condition. Thus, the SRAM cell 12 is in a known condition that will not interfere with the transfer of a bit of data from the second nv memory cell 40 to the SRAM cell 12.

At the beginning of the set phase of the power-up recall operation, the controller 24 causes $V_{RCL}$ to transition from a LOW condition to a HIGH condition to turn ON both the first and second recall FETs 46A, 46B and thereby connect the nv portion 14 to the power supply 18. After $V_{RCL}$ has entered the HIGH condition, the controller 24 causes the $V_{CCI}$ signal to transition from the LOW condition to the HIGH condition and thereby apply a voltage to the pull-up resistors 28A, 28B. As a result, the appropriate voltage is established between the gate and drain of one of the first and second SRAM FETs 26A, 268 to be turned ON while the other FET is left turned OFF. More specifically, the one of the third and fourth SNOS FETs 42A, 42B that is in depletion mode conducts current and, as a consequence, charges up the corresponding one of the first and second SRAM FETs 26A, 26B. In contrast, the one of the third and fourth SNOS FETs 42A, 42B that is in the enhancement mode does not conduct current because its gate is at ground and, as a consequence, the corresponding one of the first and second SRAM FETS 26A, 26B is not charged up. Thus, the bit of data that was stored in the second memory cell 40 is transferred to the SRAM cell 12.

With continuing reference to FIG. 2, the recall operation with respect to the first nv memory cell 36 has both set-up and set phases, just as with the recall operation for the second nv memory cell 40. Further, the controller 24 manages the state of the BLT, BLC, WL, $V_{RCL}$ and $V_{STR}$ during the set-up and set phases in the same manner as noted with respect to the second nv memory cell 40. However, for the recall operation with respect to the first nv memory cell 36, the controller 24 manages the $V_{SE1}$ and $V_{SE2}$ signals differently. Specifically, the controller 24 places $V_{SE1}$ in a LOW condition for the duration of the recall operation, just as $V_{SE2}$ was in a LOW condition for the during of the recall operation for the second nv memory cell 40. With respect to $V_{SE2}$, the controller 24 places $V_{SE2}$ in a LOW condition at the beginning of the set-up phase and then causes $V_{SE2}$ to transition to a HIGH condition to connect the first nv memory cell 36 to the power supply 18 and to aid in placing the SRAM 12 in the previously noted, known condition. In the set phase, the controller maintains $V_{SE1}$ in the LOW condition. The controller 24 also maintains $V_{SE2}$ in the previously established HIGH condition until the bit of data has been transferred from the first nv memory cell 36 to the SRAM 12. More specifically, the one of the first and second SNOS FETs 38A, 38B that is in depletion mode conducts current and, as a consequence, charges up the corresponding one of the first and second SRAM FETs 26A, 26B. In contrast, the one of the first and second SNOS FETs 38A, 38B that is in the enhancement mode does not conduct current because its gate is at ground and, as a consequence, the corresponding one of the first and second SRAM FETs 26A, 26B is not charged up. Thus, the bit of data that was stored in the first memory cell 36 is transferred to the SRAM cell 12.

It should be appreciated that the recall operations with respect to the first nv memory cell 36 and second nv memory cell 40 can occur in any order, i.e., in a random order.

In transferring a bit of data between the SRAM cell 12 and the exterior environment, the controller 24: (1) places each of $V_{RCL}$, $V_{SE1}$, $V_{SE2}$ and $V_{STR}$ in a LOW condition to isolate the nv portion 14 from the power supply 18 and the SRAM cell 12; (2) places $V_{CCI}$ in a HIGH condition to provide power to the SRAM cell 12; and (3) uses BLT, BLC and WL to effect the transfer of a bit of data between the SRAM cell 12 and the exterior environment.

Figure 3:
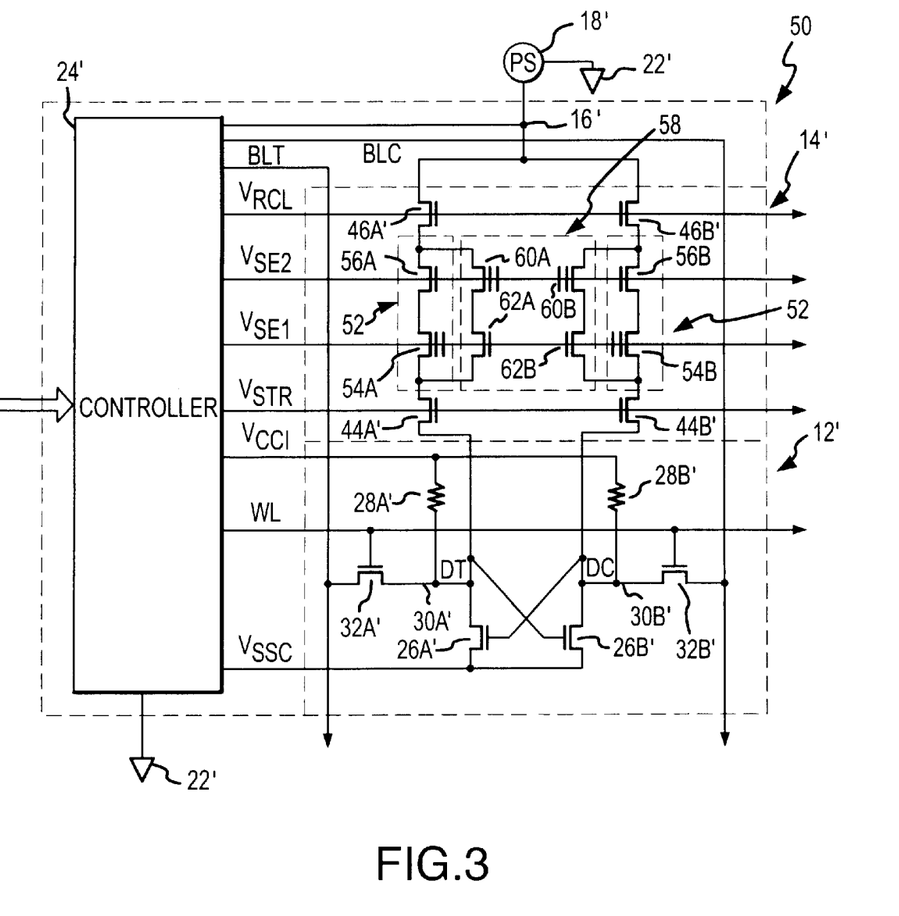
FIG. 3 illustrates a first embodiment of an nvSRAM device that includes a memory cell comprised of a static random access memory (SRAM) memory cell and two, parallel-connected, non-volatile (nv) memory cells and a controller for managing: (a) the transfer of a bits of data between the SRAM memory cell and the nv memory cells and (b) the transfer of bits of data between the SRAM memory cell and the exterior environment.

FIG. 3 illustrates an nvSRAM device with a single SRAM and two, parallel-connected, nv memory cells, hereinafter referred to as nvSRAM device 50. While the nvSRAM device 50 is illustrated as having a single nvSRAM memory cell (in this case, the single SRAM and the two nv memory cells), it should be appreciated that an nvSRAM device typically includes a plurality of nvSRAM cells that are integrated with a controller onto a single semiconductor chip.

The nvSRAM device 50 includes an SRAM 12' that is functionally equivalent to the SRAM 12 described with respect to the nvSRAM 10. Namely, the SRAM cell 12' is capable of: (1) receiving a bit of data from an exterior environment via bit lines; (2) storing the bit of data; and (3) transmitting the bit of data back to the exterior environment via the bit lines at a later time.

Also included in the nvSRAM device 50 is an nv portion 14' that is functionally equivalent to the nv portion 14 described with respect to the nvSRAM 10. Namely, the nv portion 14' is capable of: (1) receiving two bits of data from the SRAM cell 12' as a result of two separate store operations that each provide one bit of data and occur when sufficient power is being provided to the device 50; (2) retaining the two bits of data even in the absence of power being provided to the device 50;

and (3) then transmitting the bits of data back to the SRAM cell 12 in two separate recall operations that occur when sufficient power is being provided to the device 50.

A power line 16' is provided for connecting the nvSRAM device SO to a power supply 18' and a ground line 20' (Vssc) is provided for connecting the nvSRAM device 50 to ground 22'. The nvSRAM 50 is suited for use with various power supplies as described with respect to the nvSRAM device 10.

A controller 24' is included in the nvSRAM device 50 that is functionally equivalent to the controller 24' described with respect to the nvSRAM 10. Namely, controller 24' is capable of: (1) providing signals to SRAM cell 12' to transfer a bit of data between the SRAM cell 12' and the exterior environment; (2) providing signals to the SRAM cell 12' and the nv portion 14' to copy a bit of data from the SRAM cell 12' to the nv portion 14'; and (3) providing signals to the SRAM cell 12° and the nv portion 14' to copy a bit of data from the nv portion 14' to the SRAM cell 12'. The controller 24' (like controller 24): (1) causes the noted operations to be performed in response to signals received from, for example, a microprocessor; and (2) causes certain operations, such as power-up recall and power-down store operations, to be performed without any direction from a microprocessor or similar device. Further, the nv memory cell in the nv portion 14' that is used in the case of a power-down store and/or a power-up recall can be determined when the device is manufactured or be user configurable, as noted with respect to device 10.

The SRAM cell 12' includes a first SRAM FET 26A', second SRAM FET 26B', first pull-up resistor 28A', second pull-up resistor 28B', first node 30A', second node 30B', first transfer FET 32A' and second transfer FET 32B' that are interconnected and operate in the fashion described with respect to the corresponding components in the nvSRAM 10.

The nv portion 14' includes a first nv memory cell 52 for storing the state of the SRAM 12' at a first time. The first nv memory cell 52 includes a first SNOS FET 54A and second SNOS FET 54B for respectively storing the state of the first SRAM FET 26A' and the second SRAM FET 26B'. Alternatives to the use of SNOS transistors are feasible, as previously noted with respect to device 10. The state of the first and second SRAM FETs 26A', 26B' is stored in the first and second SNOS FETs 54A, 54B by forcing, in a store operation, the threshold voltages for turning ON the first and second SNOS FETs 54A, 54B to reflect the states of the first and second SRAM FETs 26A', 26B'. The first nv memory cell 52 further includes a first nv FET 56A and a second nv FET 56B for: (1) respectively isolating the first and second SNOS FETs 54A, 54B during store operations; and (2) respectively connecting the first and second SNOS FETs 54A, 54B to the power supply 18' during recall operations.

The nv portion 14 further includes a second nv memory cell 58 for storing the state of the SRAM 12' at a second time. The second nv memory cell 58 includes a third SNOS FET 60A and a fourth SNOS FET 60B for respectively storing the state of the first SRAM FET 26A' and the second SRAM FET 26B'. The first nv memory cell 52 further includes a third nv FET 62A and a second nv FET 62B for: (1) respectively isolating the third and fourth SNOS FETs 60A, 60B during store operations; and (2) respectively connecting the third and fourth SNOS FETs 60A, 60B to the power supply 18' during recall operations.

Again, it should be appreciated that the nv portion 14 can include addition nv memory cells.

The nv cell 14' further includes a first store FET 44A' and a second store FET 44B' that operate as switches during store and recall operations to appropriately configure the nv portion 14' for the transfer of a bit of data between the SRAM cell 12' and the nv portion 14'. More specifically, in response to the state of the $V_{STR}$ signal, the first and second store FETs 44A', 44B' connect the nv portion 14' to the SRAM cell 12' during store and recall operations and otherwise disconnect the nv portion 14' from the SRAM cell 12'.

The nv cell 14' further includes a first recall FET 46A' and a second recall FET 46B' that also function as switches that are used to place the nv portion 14' in the appropriate configuration for transferring a bit of data between the SRAM cell 12' and the nv portion 14' during store and recall operations. More specifically, in response to the state of the $V_{RCL}$ signal, the first and second recall FETs 46A, 46B function to connect the nv portion 14' to the power supply 18' during a recall operation and to disconnect the nv portion 14' from the power supply 18' during a store operation and otherwise.

Figure 4:
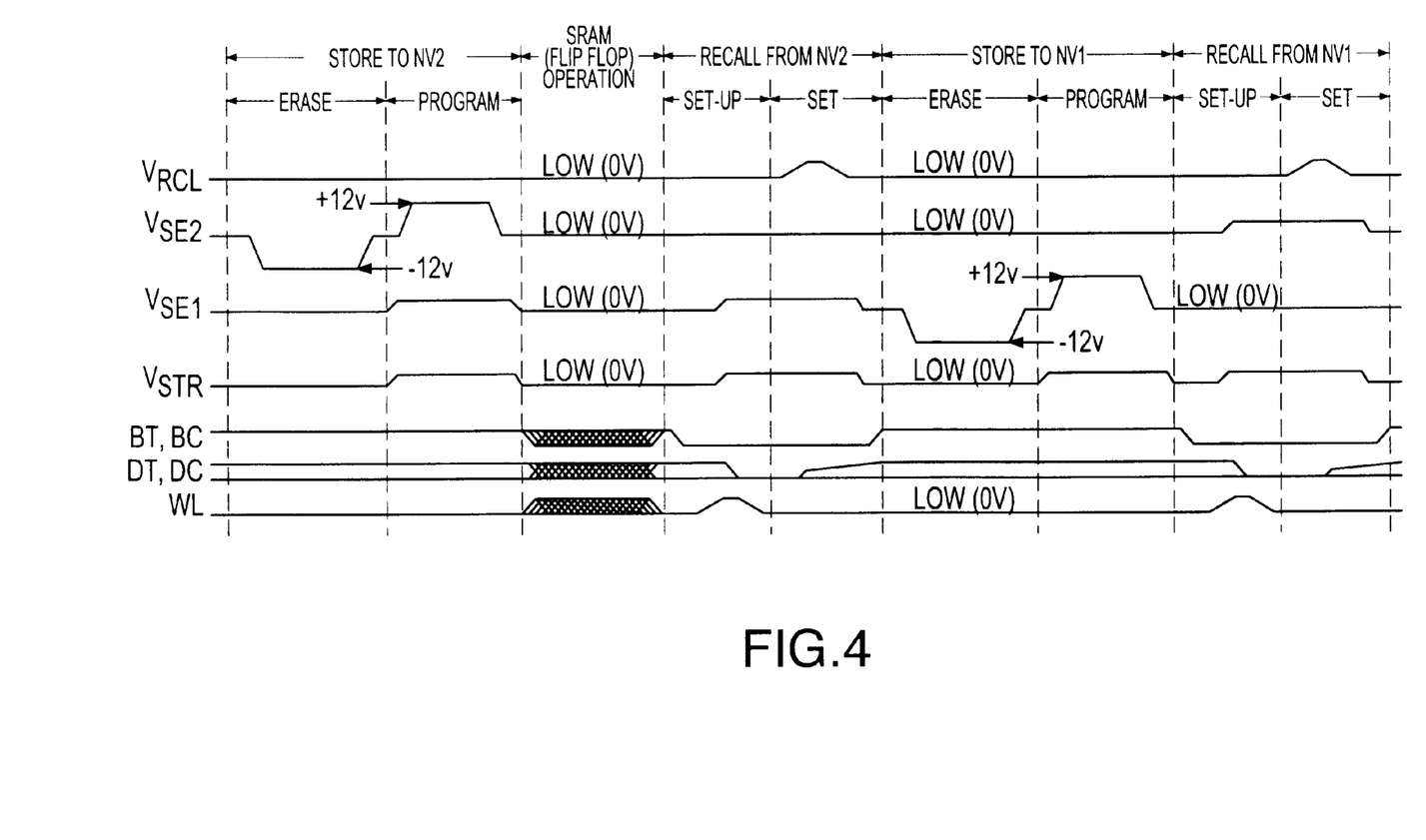
FIG. 4 is a timing diagram for the nvSRAM shown in FIG. 3 of: (a) the store and recall operations that occur between the two, parallel-connected, non-volatile memory cells and the SRAM memory cell and (b) the operations associated with transferring a bit of data between the SRAM and the exterior environment.

FIG. 4 illustrates each of the following operations associated with the nvSRAM 50: (1) a store operation to the first nv memory cell 52 (NV1); (2) a store operation to the second nv memory cell 58 (NV2); (3) a recall operation from the first nv memory cell 52; and (4) a recall operation from the second nv memory cell 58. Again, while the operations are shown as occurring in a particular sequence, the operations and, in particular, the store and recall operations can occur in any sequence, i.e., can occur in a random sequence.

The store operation with respect to the second nv memory cell 58 is described.

The store operation can occur in response to the detection by the controller 24' of a possible loss of power or in response to a command received by the controller 24'. The store operation includes an erase phase and a program phase. During the erase phase, the controller 24' places the third and fourth SNOS FETs 60A, 60B in a know state so that they can be subsequently programed to reflect the state of the first and second SRAM FETs 26A', 26B'. At the start of the erase phase, the controller places: (1) each of $V_{RCL}$, $V_{STR}$, and $V_{SE1}$ in a LOW condition; (2) $V_{SE2}$ at ground voltage; (3) $V_{CCI}$, BLT, BLC in a HIGH condition; and (4) WL and Vssc in a LOW condition. At this point, the third and fourth SNOS FETs 60A, 60B are isolated and the controller 24' transitions the $V_{SE2}$ signal from ground to a large negative voltage to place the third and fourth SNOS FETs 60A, 60B in a known condition and, more specifically, at a known depletion threshold voltage. Towards the end of the erase phase or at the beginning of the program phase, the controller 24' raises the $V_{STR}$ signal from the LOW condition to a HIGH condition to connect the SRAM cell 12' to the nv cell 14'. At the end of the erase phase, the controller 24' causes the $V_{SE2}$ signal to transition from the large negative voltage to ground.

Again, the erase phase takes approximately 6–8 ms to complete.

With continued reference to FIG. 4, the program phase of the store operation causes the threshold of the third and fourth SNOS FETs 60A, 60B to be set in manner that reflects the value of the bit of data stored in the SRAM 12. The program operation commences with the controller establishing, if it has not already done so: (1) $V_{STR}$ and $V_{SE1}$ in a HIGH condition; (2) $V_{RCL}$ in a LOW condition; and (3) $V_{SE2}$ at ground. The controller 24' does not change the states of $V_{CCI}$, BLT, BLC and WL relative to the erase phase. However, Vssc is or may be increased to approximately 1.2 volts to increase the field isolation when there is a high voltage running between the transistors associated with the nv portion 14'.

Subsequently, the controller 24' cycles the $V_{SE2}$ signal between ground and a large positive voltage to establish different threshold levels in the third and fourth SNOS FETs 60A, 60B that reflect the state of the first and second SRAM FETs 26A, 26B of the SRAM cell 12' in substantially the same fashion as noted with respect to the nvSRAM 10.

The programming phase implements a dynamic program inhibit with respect to the one of the third and fourth SNOS FETs 60A, 60B whose threshold remains unchanged after the program operation. The one of the third and fourth SNOS 60A, 60B whose threshold remains unchanged is associated with whichever of the nodes 30A', 30B' in the SRAM 12' is in a HIGH state.

With continuing reference to FIG. 4, the store operation with respect to the first nv memory cell 52 has both an erase phase and a program phase. Further, the controller manages the state of BLT, BLC, WL, $V_{RCL}$ and $V_{STR}$ during the erase and program phases in the same manner as described with respect to the store operation of the second nv memory cell 58. However, for the store operation with respect to the first nv memory cell 52, the controller 24' manages the $V_{SE2}$ and $V_{SE1}$ signals differently. To elaborate, during the erase phase, the controller 24' place $V_{SE2}$ in a LOW condition to isolate the first and second SNOS FETs 54A, 54B. At the beginning of the erase phase, the controller 24' places $V_{SE1}$ at ground and then causes $V_{SE1}$ to transition from ground to a large negative voltage to establish the depletion thresholds for the first and second SNOS FETs 54A, 54B. At the end of the erase phase, the controller 24' cause $V_{SE1}$ to return to ground. In the program phase, the controller 24' maintains $V_{SE2}$ in a LOW condition to isolate the first nv memory cell 52 from the second nv memory cell 58 and the power supply 18. The controller 24' cycles the $V_{SE1}$ to program the thresholds of the first nv memory cell 52 to reflect the state of the SRAM 12'. Just as with the program operation of the second nv memory cell 58, the program operation of the first nv memory cell 52 utilizes dynamic program inhibit. As previously noted, the use of dynamic program inhibit has a number of advantages.

With continuing reference to FIG. 4, the recall operation with respect to the second nv memory cell 58 is described. The recall operation can occur in response to the controller 24' detecting that the power being provided to the nvSRAM 50 has exceeded a predetermined threshold or in response to a command received by the controller 24. The recall operation again involves a set-up phase in which the SRAM cell 12' is placed in a condition that assures that a bit of data can be transferred from the nv portion 14' to the SRAM cell 12' and a set phase in which a bit of data resident in the second nv memory cell 58 is copied into the SRAM cell 12'. At the beginning of the set-up phase, the controller 24' establishes: (1) each of $V_{RCL}$, $V_{STR}$, $V_{SE1}$, WL, and Vssc in a LOW condition; (2) $V_{SE2}$ at ground; (3) $V_{CCI}$ in a HIGH condition; and (4) BLT and BLC in a HIGH condition. Subsequently, the controller 24' places both $V_{STR}$ and $V_{SE1}$ in a HIGH condition to connect the second nv memory cell 58 to the SRAM cell 12'. Further, the controller 24' places each of $V_{CCI}$, BLT and BLC in a LOW condition to remove power from the SRAM cell 12' and to isolate the voltages at nodes 30A', 30B'. At this point, the controller 24' cycles WL to discharge the nodes 30A, 30B and thereby place both of the nodes in a LOW. condition. Thus, the SRAM cell 12' is in a known condition that will not interfere with the transfer of a bit of data from the second nv memory cell 58 to the SRAM cell 12'.

At the beginning of the set phase of the power-up recall operation, the controller 24' causes $V_{RCL}$ to transition from a LOW condition to a HIGH condition to turn ON both the first and second recall FETs 46A', 46B' and thereby connect the nv portion 14' to the power supply 18'. After $V_{RCL}$ has entered the HIGH condition, the controller 24' cause the $V_{CCI}$ signal to transition from the LOW condition to the HIGH condition and thereby apply a voltage to the pull-up resistors 28A', 28B'. As a result, the appropriate voltage is established to turn ON one of the first and second SRAM FETs 26A', 26B' and turn OFF the other of the first and second SRAM FETs 26A', 26B'. Thus, a copy of the bit stored in the second nv memory cell 58 is transferred to the SRAM cell 12'.

With continuing reference to FIG. 4, the recall operation with respect to the first nv memory cell 52 also has set-up and set phases. Further, the controller 24' manages the state of BLT, BLC, WL, $V_{RCL}$ and $V_{STR}$ during the set-up and set phases in the same manner as noted with respect to the second nv memory cell 58. However, for the recall operation with respect to the first memory cell 52, the controller 24' manages the $V_{SE1}$ and $V_{SE2}$ signals differently. To elaborate, the controller 24' places $V_{SE1}$ in a LOW condition for the duration of the recall operation. With respect to $V_{SE2}$, the controller 24' places $V_{SE2}$ in a LOW condition at the beginning of the set-up phase and then causes $V_{SE2}$ to transition to a HIGH condition to connect the first nv memory cell 52 to the power supply 18' and to aid in placing the SRAM 12 in the previously noted, known condition. In the set phase, the controller maintains $V_{SE1}$ in the LOW condition. The controller 24 also maintains $V_{SE2}$ in the previously established HIGH condition until the bit of data has been transferred from the first nv memory cell 52 to the SRAM 12'. More specifically, the one of the first and second SNOS FETs 54A, 54B that is in depletion mode conducts current and, as a consequence, charges up the corresponding one of the first and second SRAM FETs 26A', 26B'. In contrast, the one of the first and second SNOS FETs 54A, 54B that is in the enhancement mode does not conduct current because its gate is at ground and, as a consequence, the corresponding one of the first and second SRAM FETs 26A, 26B is not charged up. Thus, a copy of the bit of data that stored in the first memory cell 52 is transferred to the SRAM cell 12'. Again, it should be appreciated that the recall operations with respect to the first nv memory cell 52 and the second nv memory cell 58 can occur in any order, i.e., in random order.

In transferring a bit of data between the SRAM cell 12 and the exterior environment, the controller 24': (1) places each of $V_{RCL}$, $V_{SE1}$, $V_{SE2}$ and $V_{STR}$ in a LOW condition to isolate the nv portion 14' from the power supply 18' and the SRAM cell 12'; (2) places $V_{CCI}$ in a HIGH condition to provide power to the SRAM cell 12'; and (3) uses BLT, BLC and WL to effect the transfer of a bit of data between the SRAM cell 12' and the exterior environment.

Figure 5:
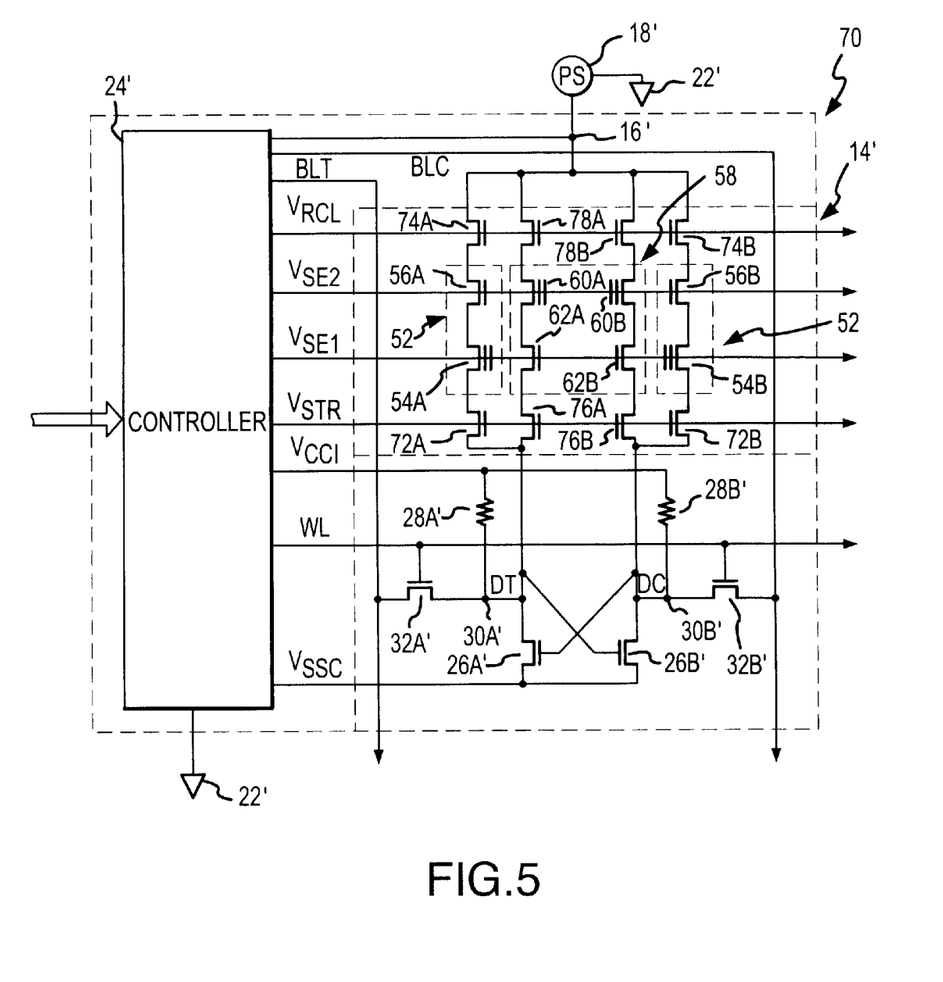
FIG. 5 illustrates a second embodiment of an nvSRAM device that includes a memory cell comprised of a static random access memory (SRAM) memory cell and two, parallel-connected, non-volatile (nv) memory cells and a controller for managing: (a) the transfer of a bits of data between the SRAM memory cell and the nv memory cells and (b) the transfer of bits of data between the SRAM memory cell and the exterior environment.

FIG. 5 illustrates a second embodiment of an nvSRAM device that includes a memory cell comprised of an SRAM cell and two, parallel-connected, nv memory cells, hereinafter nvSRAM device 70. With the exception of the FETs used to connect and disconnect the power supply from the nv portion and the FETs used to connect and disconnect the nv portion from the SRAM cell, the device 70 is identical to the nvSRAM 50. Consequently, the elements of the device 70 that are the same as those in device 50 are given the same reference numbers as the elements in device 50. The nvSRAM 70 includes: (1) first and second store FETs 72A, 72B for connecting and disconnecting the first nv memory cell 52 from the SRAM cell 12'; and (2) first and second recall FETs 74A, 74B for connecting and disconnecting the first nv memory cell 52 from the power supply 18'; (3) third and fourth store FETs 76A, 76B for connecting and disconnecting the second nv memory cell 58 from the SRAM cell 12'; and (4) third and fourth recall FETs 78A, 78B for connecting and disconnecting the second nv memory cell 58 from the power supply 18'. Other than the readily discernable changes in operation attributable to the added store and recall FETs, the operation of the nvSRAM 70 is substantially identical to that described with respect the nvSRAM 50. An advantage of the nvSRAM 70 relative to the nvSRAM 50 is that under certain sets of physical layout design rules the nvSRAM 70 is likely to produce a denser memory than the nvSRAM 50, i.e., more memory cells per unit area.

A number of modifications are possible. For instance, while the controller is depicted as being integrated onto the same chip as the nvSRAM cell or cells, the controller can also be implemented separately from the nvSRAM cells. Further, the controller and/or nvSRAM cells can be integrated onto a chip that includes other componentry, such as logic circuits and microcontrollers.

The foregoing description of the invention has been presented for purposes of illustration and description. Further, the description is not intended to limit the invention to the form disclosed herein. Consequently, variations and modification commensurate with the above teachings, and the skill or knowledge in the relevant art are within the scope of the present invention. The embodiment described hereinabove is further intended to explain the best mode known of practicing the invention and to enable others skilled in the art to utilize the invention required by their particular applications or uses of the invention. It is intended that the appended claims be construed to include alternate embodiments to the extent permitted by the prior art.

What is claimed is:

1. A non-volatile, static random access memory (nvSRAM) with the ability to store multiple bits of data for each static random access memory cell comprising:
   a static random access memory that is capable of receiving a bit of data from an exterior environment, retaining a bit of data, and transmitting a bit of data to the exterior environment;
   wherein a bit of data stored in said static random access memory can be lost if power is removed from said static random access memory;
   a non-volatile memory, operatively connected to said static random access memory, that includes a first non-volatile memory cell capable of being programmed with a differentially represented bit of data received from said static random access memory and a second nonvolatile memory cell that is also capable of being programmed with a differentially represented bit of data received from said static random access memory;
   wherein said first non-volatile memory cell is in series with said second non-volatile memory cell and located between said second non-volatile memory cell and said static random access memory; and
   a controller, operatively connected to said static random access memory and said nonvolatile memory, that is capable of causing said non-volatile memory to be programmed with a first differentially represented bit of data stored in said static random access memory at a first time and a second differentially represented bit of data stored in said static random access memory at a second time that is different than said first time.

2. The non-volatile, static random access memory, as claimed in claim 1, wherein:
   said controller is capable of causing said first non-volatile memory cell and said second non-volatile memory cell to be programmed with bits of data in any order.

3. The non-volatile, static random access memory, as claimed in claim 1, wherein:
   said controller is capable of causing a first bit of data programmed into said first non-volatile memory cell and a second bit of data programmed into said second non-volatile memory cell to be recalled to said static random access memory in any order.

4. The non-volatile, static random access memory, as claimed in claim 1, wherein:
   said controller is capable of causing a first bit of data to be transferred to said first non-volatile memory cell before a second bit of data is transferred to said second non-volatile memory cell.

5. The non-volatile, static random access memory, as claimed in claim 1, wherein:
   said controller is capable of causing a second bit of data to recalled from said second non-volatile memory cell before a first bit of data is recalled from said first non-volatile memory cell.

6. The non-volatile, static random access memory, as claimed in claim 1, further comprising:
   a first switching device, located between said static random access memory and said non-volatile memory, for selectively connecting and disconnecting said static random access memory and said non-volatile memory; and
   a second switching device, located between said non-volatile memory and a power supply connection, for selectively connecting and disconnecting said non-volatile memory and a power supply connection.

7. The non-volatile, static random access memory, as claimed in claim 6, wherein:
   said controller is capable of using said first and second switches to cause a bit of data to be programmed into one of said first and second non-volatile memory cells with dynamic program inhibit.

8. The non-volatile, static random access memory, as claimed in claim 1, wherein:
   said non-volatile memory and said controller are capable of implementing a dynamic program inhibit operation during the programming of a bit of data stored in said static random access memory into either said first non-volatile memory cell or said second non-volatile memory cell.

9. The non-volatile, static random access memory, as claimed in claim 1, wherein:
   said non-volatile memory includes more than two non-volatile memory cells connected in series.

10. A non-volatile, static random access memory (nvSRAM) with the ability to store multiple bits of data for each static random access memory cell comprising:

a static random access memory that is capable of receiving a bit of data from an exterior environment, retaining a bit of data, and transmitting a bit of data to the exterior environment;

wherein a bit of data stored in said static random access memory can be lost if power is removed from said static random access memory;

a non-volatile memory, operatively connected to said static random access memory, that includes a first non-volatile memory cell capable of being a differentially represented bit of data received from said static random access memory, a second non-volatile memory cell that is also capable of being programmed with a differentially represented bit of data received from said static random access memory;

a first switching device for selectively connecting and disconnecting said static random access memory and said non-volatile memory;

a second switching device for selectively connecting and disconnecting said non-volatile memory and a power supply connection;

wherein said first non-volatile memory cell is in series with said second non-volatile memory cell and located between said second non-volatile memory cell and said static random access memory;

a controller, operatively connected to said static random access memory and said non-volatile memory, that is capable of causing said non-volatile memory to be programmed with a first differentially represented bit of data stored in said static random access memory at a first time and a second differentially represented bit of data stored in said static random access memory at a second time that is different than said first time.

11. The non-volatile, static random access memory, as claimed in claim 10, wherein:

said non-volatile memory and said controller are capable of implementing a dynamic program inhibit operation during the programming of a bit of data stored in said static random access memory into either said first non-volatile memory cell or said second non-volatile memory cell.

12. The non-volatile, static random access memory, as claimed in claim 10, wherein:

said non-volatile memory and said controller are capable of causing said first non-volatile memory cell and said second non-volatile memory cell to be programmed with bits of data in any order.

13. The non-volatile, static random access memory, as claimed in claim 10, wherein:

said non-volatile memory and said controller are capable of causing a first bit of data programmed into said first non-volatile memory cell and a second bit of data programmed into said second non-volatile memory cell to be recalled to said static random access memory in any order.

14. A non-volatile, static random access memory (nvSRAM) with the ability to store multiple bits of data for each static random access memory cell comprising:

a static random access memory that is capable of receiving a bit of data from an exterior environment, retaining a bit of data, and transmitting a bit of data to the exterior environment;

wherein a bit of data stored in said static random access memory can be lost if power is removed from said static random access memory;

a non-volatile memory, operatively connected to said static random access memory, that includes a first non-volatile memory cell capable of being programmed with a differentially represented bit of data received from said static random access memory and a second non-volatile memory cell that is also capable of being programmed with a differentially represented bit of data received from said static random access memory;

an isolation device, located between said static random access memory and said non-volatile memory, to prevent said static random access memory from experiencing a voltage outside the normal voltage range for read and write operations to said static random access memory during a programming of said non-volatile memory;

a controller, operatively connected to said static random access memory and said non-volatile memory, that is capable of causing said non-volatile memory to be programmed with a first differentially represented bit of data stored in said static random access memory at a first time and a second differentially represented bit of data stored in said static random access memory at a second time that is different than said first time.

15. The non-volatile, static random access memory, as claimed in claim 14, wherein:

said first non-volatile memory cell is in series with said second non-volatile memory cell and located between said second non-volatile memory cell and said static random access memory.

16. The non-volatile, static random access memory, as claimed in claim 14, wherein:

said first non-volatile memory cell is in parallel with said second non-volatile memory cell.

17. The non-volatile, static random access memory, as claimed in claim 14, wherein:

said isolation device includes a first switching device, located between said static random access memory and said non-volatile memory, for selectively connecting and disconnecting said static random access memory and said non-volatile memory.

18. The non-volatile, static random access memory, as claimed in claim 14, wherein:

said controller is capable of causing said first non-volatile memory cell and said second non-volatile memory cell to be programmed with bits of data in any order.

19. The non-volatile, static random access memory, as claimed in claim 14, wherein:

said controller is capable of causing a first bit of data programmed into said first non-volatile memory cell and a second bit of data programmed into said second non-volatile memory cell to be recalled to said static random access memory in any order.

* * * * *

UNITED STATES PATENT AND TRADEMARK OFFICE
CERTIFICATE OF CORRECTION

PATENT NO. : 6,414,873 B1
DATED : July 2, 2002
INVENTOR(S) : Christian E. Herdt

It is certified that error appears in the above-identified patent and that said Letters Patent is hereby corrected as shown below:

Column 1,
Line 22, after "portable", delete ".";
Line 29, after "random", delete ",";

Column 2,
Line 32, after "more", delete ".";

Column 4,
Line 13, after "sufficient", delete ":";

Column 5,
Line 22, after "FET", insert -- . --;
Line 41, after "and", delete "and, a" and insert -- and a --;

Column 6,
Line 52, after "SRAM", delete ",";

Column 8,
Line 55, delete "V $_{SE1}$ and the V $_{SE2}$", and insert -- $V_{SE2}$ and the V $_{SE1}$ --;

Column 11,
Line 9, delete the paragraph break;
Line 14, delete "SO", and insert -- 50 --;
Line 27, delete "12º", and insert -- 12' --;

Column 12,
Line 41, delete the paragraph break;
Line 65, delete the paragraph break;

Column 13,
Line 13, delete the paragraph break;

Column 14,
Line 8, after "LOW", delete ".";

UNITED STATES PATENT AND TRADEMARK OFFICE
CERTIFICATE OF CORRECTION

PATENT NO.    : 6,414,873 B1
DATED         : July 2, 2002
INVENTOR(S)   : Christian E. Herdt It is certified that error appears in the above-identified patent and that said Letters Patent is hereby corrected as shown below:

Column 15,
Line 62, delete "nonvolatile", and insert -- non-volatile --;

Column 16,
Line 4, delete "nonvolatile", and insert -- non-volatile --;

Column 17,
Line 10, delete "being a dfferentially", and insert -- being programmed with a differentially --.

Signed and Sealed this

Eleventh Day of March, 2003

JAMES E. ROGAN
*Director of the United States Patent and Trademark Office*